United States Patent [19]

Behn

[11] Patent Number: 4,670,639

[45] Date of Patent: Jun. 2, 1987

[54] METHOD FOR THE FORMATION OF NARROW, METAL-FREE STRIPS IN A METAL LAYER ON PLASTIC SHEETS

[75] Inventor: Reinhard Behn, Munich, Fed. Rep. of Germany

[73] Assignee: Siemens Aktiengesellschaft, Berlin and Munich, Fed. Rep. of Germany

[21] Appl. No.: 849,871

[22] Filed: Apr. 9, 1986

[30] Foreign Application Priority Data

Apr. 24, 1985 [DE] Fed. Rep. of Germany ....... 3514824

[51] Int. Cl.$^4$ .............................................. B23K 26/00
[52] U.S. Cl. ......................... 219/121 LJ; 219/121 LT
[58] Field of Search .................. 219/121 LH, 121 LJ, 219/121 LS, 121 LT, 121 L, 121 LM; 156/634

[56] References Cited

U.S. PATENT DOCUMENTS

| 3,786,224 | 1/1974 | Heywang et al. | 219/121 LM |
| 3,895,207 | 7/1975 | Heywang et al. | 219/68 |
| 4,081,653 | 3/1978 | Koo et al. | 219/121 LJ |
| 4,322,601 | 3/1982 | Serlin | 219/121 LE |
| 4,462,062 | 7/1984 | Rayburn | 361/323 |
| 4,568,815 | 2/1986 | Kimberg | 219/121 L |
| 4,598,039 | 7/1986 | Fischer et al. | 219/121 EK |

FOREIGN PATENT DOCUMENTS

| 0131504 | 3/1985 | European Pat. Off. |  |
| AS1938320 | 2/1971 | Fed. Rep. of Germany |  |
| OS2348904 | 4/1975 | Fed. Rep. of Germany |  |
| AS2509543 | 9/1976 | Fed. Rep. of Germany |  |
| OS3224234 | 3/1983 | Fed. Rep. of Germany |  |
| 2103198 | 4/1972 | France |  |
| 0028095 | 3/1977 | Japan | 219/121 LT |
| 0168989 | 12/1981 | Japan | 219/121 LH |

OTHER PUBLICATIONS

G. Hurtig III et al., "An Overview of Laser Functional Trimming Techniques", May 13–15, 1974, 24th Electronic Components Conf., Washington, D.C.

Primary Examiner—C. L. Albritton
Attorney, Agent, or Firm—Hill, Van Santen, Steadman & Simpson

[57] ABSTRACT

A method for forming narrow metal-free strips in a metal layer on a plastic sheet from which to manufacture capacitors provides moving the sheet relative to a plurality of pulsed laser beams arranged parallel to one another in a single plane parallel to the direction of translational motion of the sheet to successively generate metal-free areas which are overlapped to form a narrow, completely metal-free strip.

12 Claims, 6 Drawing Figures

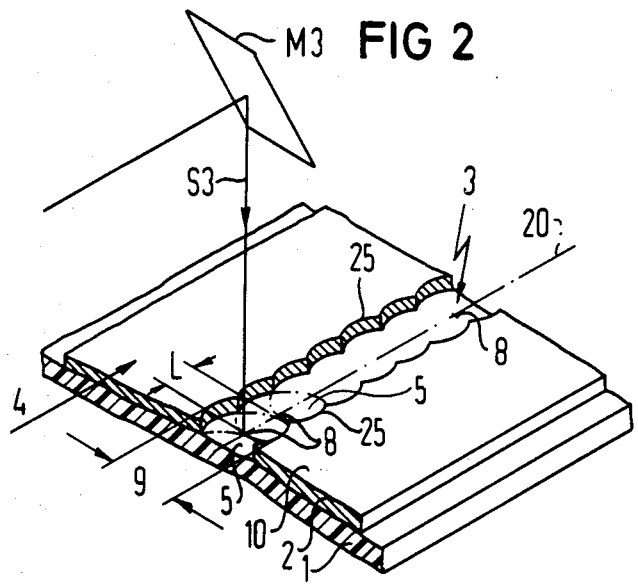
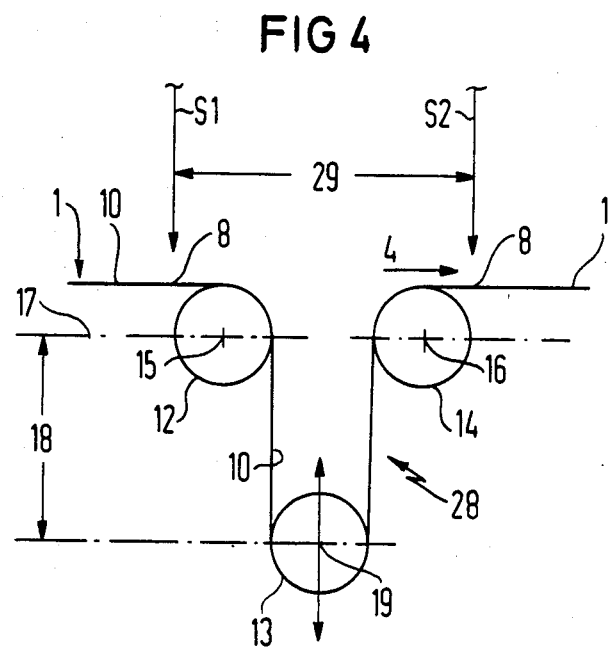

METHOD FOR THE FORMATION OF NARROW, METAL-FREE STRIPS IN A METAL LAYER ON PLASTIC SHEETS

BACKGROUND OF THE INVENTION

1. Field of the Invention

The present invention relates generally to a method for forming metal-free strips on a plastic sheet that is used to manufacture electrical capacitors and, more particularly, to a method using pulsed laser beams to remove a regenerably thin layer of vaporizable metal from a plastic sheet.

2. Description of the Prior Art

U.S. Pat. No. 4,462,062 discloses a method wherein a broad plastic sheet with a completely metallized surface is moved past a laser ablation station having a plurality of laser beams to form narrow demetallized strips. The plurality of laser beams are incident to the sheet in a line perpendicular to the direction of the sheet feed so that each laser beam forms a metal-free strip.

For manufacturing capacitors, broad, usually stretched, plastic sheets of polyethylene terephthalate, polycarbonate, polypropylene or other suitable dielectric material is provided with metal-free strips and is cut into narrow bands which have a demetallized free edge at one edge and which are processed into round or flat windings or which are layered in accordance with a known method.

The capacitor windings or stacks have contacts applied at the end faces by a metal spraying method so that all metallized layers which extend up to the edge of the end face are connected to one another in an electrically conductive fashion.

Instead of completely demetalizing the free edge of the dielectric in a region adjacent one end face, narrow plastic bands in the form of thin metal-free strips can be used to insulate the edge region of the metallized layers from the capacitively effective region of the metallization. For uniform windings and stacks, twice the number of metallized layers are available for contacting at each end face which thereby noticeably boosts the adhesion of the sprayed on metal contact layer. The metal-free strips can be extremely thin, for instance, for capacitors having a nominal voltage of 63 v., insulating strips having a width of only 0.1 mm have been found to be adequate.

Various methods are known for forming the exposed edges, or insulating strips, on thin metal-coated plastic sheets. For example, in German Patent 0S No. 3 224 234, a method is disclosed which largely preserves the sheet material having a thickness of only a few $\mu$m which uses diaphrams entrained cover bands, on removable protective layers in an oil base. The oil base keeps defined strip-shaped regions of the sheet surface free of a metal during the metallization of the sheet by vapor deposition in a vacuum. In such method, the metal-free strips cannot be formed arbitrarily narrow. The lower limit for forming metal-free strips by such method is a width of approximately 1 mm. Another disadvantage of the above method is that residues of covering oil often remain in the edge regions of the strips that are formed and these oil residues work into the capacitor winding and change the capacitor properties over the long term.

Finally, broad plastic sheets which are already provided with metal-free strips during the metallization process can only be used for purposes that have been defined from the outset of the sheet manufacture.

Also known are methods for subsequently providing broad, completely metallized plastic sheets with metal-free strips. For example, in German 0S No. 2 348 904, a method is disclosed wherein circular burn-out disks or wheels having a thickness corresponding to the width to the strips to be burned out, and acting as burn-out electrodes, are resiliently pressed against the metallization of a metallized plastic sheet conducted in self-bearing fashion to cause topically limited destruction of the metallization by an electrical current. The metallization functions as the cooperating electrode to the electrically charged disk or wheel.

Such method of ablating undesired metal layers by a voltage carrying electrode is not without problems, particularly for thin plastic sheets since the extremely thin sheets are easily deformed or damaged at the ablated locations as a result of the sheet's thermoplastic properties.

Purely mechanical methods for removing the metal layer from the plastic sheets are also known, wherein the metal layer is ground off by rotating grinding wheels. In German Patent AS No. 2 509 543 is disclosed grinding wheels fashioned of bonded hard sharp edged grains of various degrees of fineness. The plastic sheet is pressed against the grinding wheels with a defined contact pressure by controlling the sheet tension.

As shown in German AS No. 1 938 320, the grinding wheels may be formed of rubber or silicone caoutchouc. The grinding wheels for removing regions of the metal layers are driven at high speeds and are arranged to press against a mating roll via an insulator band conducted therebetween.

The rubbing off, or abrasion of the metallized layers by grinding wheels of rubber or siliconed caoutchouc rotating at high speeds is easily accomplished and practiced, although it does involve some outlay due to the necessary pressure against the mating roll. However, with such method, there is the danger of overstretching and damaging the plastic sheets in the regions to be demetallized.

In the use of grinding wheels formed of hard, sharp edged grains, there is a risk of grinding through the sheet wherein a pressure roll can be omitted. Finally, as disclosed in the above-mentioned German AS No. 1 938 320, the width of the metal-free strips is limited by the thickness of the burnout or grinding wheels, for example, to a width of 0.3 mm.

While ablating the metal coating with an intense laser pulse is an extremely flexible method for generating metal-free strips on metallized plastic sheets, since the lack of physical contact is relatively gentle on the sheets, and thus avoids many disadvantages of the known methods. As set forth in the aforementioned U.S. Pat. No. 4,462,062, the laser pulse method has an added advantage that extremely narrow strips can be produced.

Generally, very high intensity laser beams present a problem in demetalizing thin plastic sheets. A continuous laser beam, or a pulsed laser beam impinging the same region of the sheet in quick succession, can not only evaporate the metal layer, but also heat, and even destroy, the thermoplastic material of the plastic sheet.

Not only is melting or evaporation of the sheet material a problem, but even at temperatures noticeably lower than the melting point of the plastic, the stretched plastic sheet is destretched. This results, for example, in folds and ripples appearing in the sheet material to the point that the sheet becomes unstable for manufacturing faultless capacitor windings and stacks. For this reason, temperature stable plastic sheets are processed by this method.

SUMMARY OF THE PRESENT INVENTION

An object of the present invention is to specify a method for producing metal-free strips with a reduced thermal load on the sheet material so that very thin sheets and sheets composed of less temperature stable plastics can be processed with economical demetallization rates.

Extremely short, intense laser pulses are used to evaporate the metallization at the point of incidence of the laser beam. For example, a regenerably thin metal layer of aluminum having a thickness of between 0.02 micrometers through 0.05 micrometers and a surface conductivity below one Siemens, or mho, produces a metal-free area whose size and shape essentially corresponds to the shape and size of the laser beam on the sheet surface.

By joining partially overlapping demetallized areas, a coherent metal-free strip on the metallized sheet is formed, typically having a ripply, or wavy, edge, when all precautionary measures are observed.

In the present method, the feed rate with which a metallized plastic sheet to be provided with metal-free strips is moved relative to a pulsed laser beam at a laser ablation station is increased by a multiple as compared to prior methods, given the same clock frequency of the laser pulses. The thermal load on the sheet material is reduced over the prior art methods as well.

According to the present invention, the method includes the steps of:

(a) Moving the metallized plastic sheet with a feed rate relative to a plurality of laser beams pulsed with a clock frequency f which charges the metal layer of the plastic sheet in the region of the strip to be demetallized. The laser beams are arranged parallel to one another in a single plane parallel to the direction of the translational movement of the sheet.

(b) Only one area of the metal layer is evaporated at each pulse due to the duration and intensity of the individual pulses of the laser beams.

(c) The spacing of the centers of two areas successively demetallized by the same laser beam results from the feed rate of the sheet and the clock frequency of the laser pulses. The spacing, referred to as clock spacing, at least amounts to a multiple of half the length of the demetallized areas which corresponds to the plurality (n) of laser beams used, but at most amounts to the n-multiple of the length of the demetallized surfaces shortened by half the demetallized area width.

(d) Center spacing of the regions at which two neighboring laser beams impinge the sheet surface is referred to as the cooling path. The cooling path is greater by the $n^{th}$ portion of the clock spacing than a whole multiple of the clock spacing of the centers of two adjoining areas demetallized by the same laser beam.

One problem with practicing the known methods is that cooling is not taken into consideration. Every laser pulse must be followed by a cooling phase during which the sheet substrate, which is only a few micrometers thick, can cool to such a degree in the area already demetallized that the following laser pulse does not lead to an undesirable deformation or destruction of the thermoplastic sheet. In the known method, the following laser pulse, due to the feed motion of the sheet relative to the laser beams, impinges the sheet offset, for example, by half the length of the demetallized area.

By way of definition, half the length of the demetallized area for a circular area is the radius of the circle and half the length of the demetallized area for elliptical areas is the larger semi-axis of the ellipse.

The duration of a cooling phase is determined by the degree to which the sheet is heated by the metal layer being heated above the evaporation temperature at every laser pulse in the region of the point of incidence, and by the metal vapor situated above the sheet surface and excited and heated by the laser pulses. A further factor in defining the cooling phase is the degree of heat dissipation in the adjoining sheet regions.

For a given laser pulse intensity which is determined by the properties of the metallization layer and of the plastic sheet, the maximum attainable feed rate of the sheet is defined by the required cooling time and the offset distance of the distance between the centers of two neighboring demetallized areas.

Not only can the method of forming metal-free areas in metallized plastic sheets by means of pulsed laser beams be utilized for extremely thin metal layers having surface conductivities below 1 Siemens, or mho, but also by modifying the duration of the laser pulse, the present method can be used for noticeably thicker metal layers having surface conductivities above 1 Siemens, or mho.

In the prior method, very thin sheets having a thickness of less than 2 micrometers can be provided with metal-free strips very slowly by means of laser beams since the necessary cooling time is correspondingly long. For sheets of 3 micrometers thickness that have a 3 nanometer thick metal layer of aluminum thereon, demetalizing speeds of at most 2.5 meters per second through 3 meters per second are achieved. However, at this maximum speed, deformations of the sheet material appear.

The plastic bands are metallized at speeds of 6 meters per second and above, and, thus, the known obtainable demetallization rates are clearly below that of the metallization rates. Thus, no effective and advantageous coupling of these processes is possible for the known method.

The present method provides adequately large dimensioning of the cooling distance at a given clock frequency of the laser pulses to enable a significant longer cooling phase before the incidence of the next laser pulse on a part of an already demetallized area of the sheet. Thus, overheating of especially thin sheets is practically impossible in the demetalizatin region. Of course, the present method can also be used with equal advantage for thicker sheets. For example, the present method can be used with sheets having a thickness of more than 10 micrometers.

The feed rate of the sheet in the present method is increased by a factor of n over the prior methods given the same clock frequency of the laser pulses, where n corresponds to the number of laser beams used.

A particular advantage of the present invention enables the processing of especially thin metallized layers having a material thickness of 2 micrometers or less. Such sheets have heretofore to been capable of being demetallized with laser beams only at uneconomically slow speeds. The present invention thus represents not only a technical, but also an economical advance.

According to the method of the invention, the clock frequency of the laser pulses and the feed rate of the sheet relative to the laser beams can be further increased since the same laser beam no longer impinges an already demetallized, and therefore heated, region of the sheet. If two laser beams are used in the present invention, only a slight overlap occurs of successively demetallized areas by the same laser beam.

It has been found that the excess temperature of the sheet in the environment of a demetallized area decays exponentially so that even a slight increase in the spacing at the centers of two areas being successively demetallized by the same laser beam effects a noticeable shortening of the cooling phase required before the incidence of the next laser pulse of this laser beam. The cooling phase is essentially defined by the remaining heat effect on the sheet of the hot metal vapor located above the point of incidence of the laser beam. By providing a tangential flow of an inert gas, such as nitrogen, the remaining heat effect is to a large extent suppressed by the removal of the metal vapor from the region of the laser emission perpendicular to the band feed direction.

Since, with the present method, it is possible to process even extremely thin plastic sheets at demetallization rates that correspond to rates with which the sheets are provided with a metal layer, it is possible to provide a very economical coupling of the two processees.

Lasers suitable for use in the present method generally are far more powerful than the energy required for vaporizing the thin metallized layers. As such, a single laser beam is used to generate n laser beams arranged in a single plane parallel to one another by using $n-1$ semireflecting mirrors and one totally reflecting mirror. The original laser beam is divided into n laser beams of approximately equal energy by selecting the reflectivity of the individual semireflecting mirrors. While the number n of laser beams generated by such semireflecting mirrors is usually less than ten, the only fundamental limit is the available laser intensity and the pulse intensity required for vaporizing the metal layer.

For example, four laser beams ($n=4$) requires $n-1=3$ semireflecting mirrors. Each of the mirrors branch off 25% of the laser intensity of the original laser beam. In table 1 below, the required values for transmission and reflection of the four mirrors at the wave length of the laser emission is specified, neglecting the absorption of the mirrors.

The use of n number of pulsed layers would require synchronization of the laser beams, however, the present procedure by providing a plurality of beam generated from a single source makes such synchronization superfluous.

According to the present invention, another advantage is that a metallized plastic sheet is conducted between two neighboring laser beams by at least one arrangement of three deflection rollers. The first and third deflection rollers lie in a single plane with respect to their axis and the second deflection roller is disposed between the first and third deflection roller outside such plane. The deflection rollers are formed of metal or some other thermally conducting material. The distance of the axis of the second deflection roller from the plane of the first and third deflection rollers is adjustable so as to set a required cooling distance of the plastic sheet.

As a result of this development, the spacing between individual laser beams is reduced without shortening the cooling distance. Furthermore, different cooling distances can be set as required without undertaking adjustment of the laser beam spacing.

By guiding the sheet between the points of incidence of neighboring laser beams over deflection rollers of metal or some other material having good thermal conductivity, the demetallized and thus heated regions of the plastic sheets are cooled before the incidence of the next laser pulse.

When n laser beams are arranged to vertically impinge the surface of the metallized plastic sheet, a symmetrical energy distribution in the region of the point of incidence of the laser beam on the surface is present. By using such laser beam arrangement in the present method, the areas are demetallized with particular uniformity.

In some embodiments, an optical apparatus is introduced into the beam path to influence the beam cross-section. Metal-free areas are thus formed in the shape of elipses or oblong holes whose long dimension coincides with the direction of the translational motion of the plastic sheet. Such optical apparatus includes lenses or diaphrams introduced into the beam path of the respective laser beams, such as is known by persons skilled in the art.

For example, oblong areas having a shape corresponding to the cross section of an oblong hole are especially well-suited for the present method. At every individual laser pulse, a thin, long strip with rounded end regions is demetallized. So long as the distance over which the neighboring demetallized areas overlap along the connecting line of their centers is not greater than the width of the demetallized areas in forming a demetallized strip, the strip edge exhibits practically no ripple.

In a preferred embodiment of the present invention, the metallized sheet is manufactured of a plastic that is largely transparent to the emission of the laser beam. This avoids the absorption of large amounts of energy of the laser pulses such as would lead to undesired heating of the sheet in the region of the point of incidence of the laser emission.

Using such transparent sheets, it is possible to impinge the metal layer from the backside and through the plastic sheet. Metal-free areas are, thus, formed without deformation or damage to the thermoplastic sheeting.

An example of such an arrangement includes using a neodymium-YAG-laser (YAG=yttrium-aluminum-garnet) having a laser wave length of 1.06 micrometers with a sheet material of thickness 3 micrometers and formed of polythylene terephthalate results in the absorption of only a few percent of the incident laser intensity.

It is also within the spirit of the present invention to form a plurality of metal-free strips in the metal layer of a plastic sheet by directing a plurality of sets of respectively n laser beams onto the various regions of the sheet surface to be demetallized next to one another in accordance with the present invention. Thus, a single metal-free strip is formed with each set of n laser beams.

BRIEF DESCRIPTION OF THE DRAWINGS

FIG. 2 is a perspective view of the formation of a metal-free strip by means of a single laser;

FIG. 4 is a side elevational view of a sheet guidance system for guiding metallized sheets between neighboring laser beams.

DESCRIPTION OF THE PREFERRED EMBODIMENTS

In FIG. 1 are shown schematically various examples for forming metal-free strips in a metal layer of a metallized plastic sheet. The strips are formed by successively joining partially overlapping demetallized areas offset from each other by a defined distance. The areas are formed by a short intense pulse of a laser beam which vaporizes the metal in the region of the point of incidence of the beam emission on the sheet surface. The shape of these demetallized areas can be varied by a combination of lenses and diaphrams.

Figure 1A:
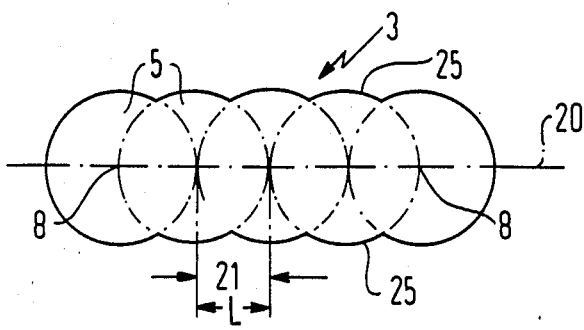
FIG. 1a illustrates one embodiment of the formation of metal-free strips by overlapping circular demetallized areas.

Firstly, a strip 3 that is formed by joining circular areas 5 is shown in FIG. 1a. The areas 5 overlap by a distance 21 along a line 20 connecting their respective centers 8. The distance 21 corresponds to the radius L of each of the circular areas 5. The strip formed thereby exhibits a typical, wavey edge region 25. In one embodiment, the areas 5 have a radius of 0.1 mm although areas of smaller or larger size can also be formed.

Figure 1B:
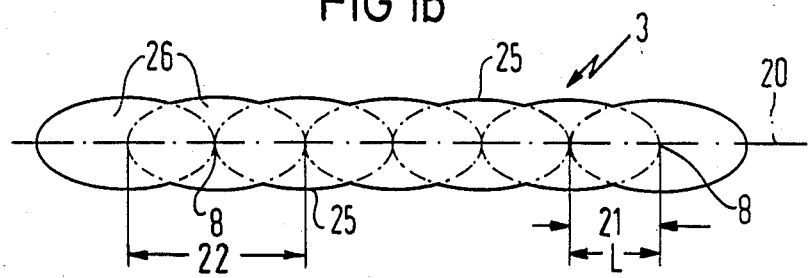
FIG. 1b illustrates a second embodiment of the formation of metal-free strips similar to that shown in FIG. 1a including elliptical areas.

FIG. 1b shows the joining of elliptically shaped areas 26 which overlap each other by a distance 21. The distance 21 corresponds to the large semi-axis L extending along the line 20 connecting the centers 8 of the elliptical areas 26. The elliptically shaped areas 26 likewise, form an edge region 25 that is wavey.

Figure 1C:
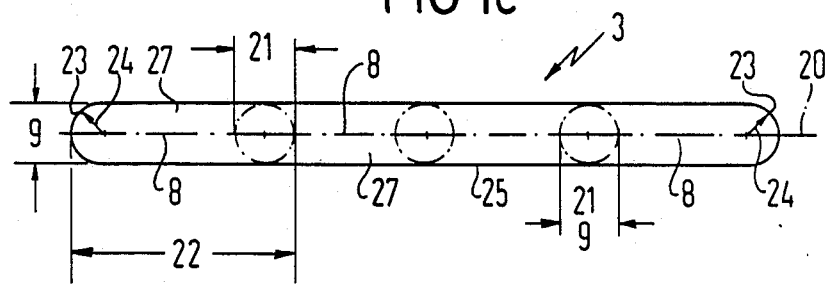
FIG. 1c illustrates yet another embodiment of the formation of metal-free strips similar to that shown in FIG. 1a including oblong circular areas.

A metal-free strip 3 is shown in FIG. 1c formed by joining areas 27, where the shape of the areas 27 corresponds to the cross section of an oblong hole. The areas 27 have a width 9 that is smaller than their length 22, as well as round ends 23 having a radius 24. The radius 24 corresponds to exactly one-half the width 9 of the strip 3. The areas 27 overlap along the line 20 connecting the centers 8 by a distance 21 which corresponds to the width 9 of the areas 27. Thus, is formed a continuous demetallized strip 3 whose edge region 25 is smooth.

The areas 27 in one embodiment have a length 22 of 0.5 mm and a width 9 of 0.2 mm.

Referring to FIG. 2, a schematic representation is shown of the formation of a completely demetallized strip in a metal layer 2 on a plastic sheet 1. Substantially circular metal-free areas 5 which are generated by a single intense laser pulse of a laser beam S3 are joined by partially overlapping. Upon incidence of the laser beam S3 surface 10, the material of the metallization 2 is suddenly vaporized in the region of the point of incidence. The laser beam S3 is reflected perpendicularly onto the sheet surface 10 by a mirror M3.

The plastic sheet 1 is moved with a feed rate v in a band running direction 4 relative to the laser beam S3. The feed rate v is synchronized with the clock frequency f of the laser beam such that the overlap distance by which successively demetallized areas 5 overlap along the center connecting line 20 just corresponds to the radius L of the areas 5. Such synchronization of the feed rate v with the clock frequency f represents a reasonable compromise between the highest possible demetallization rate and the smoothest possible edge region 25 of the strip 3.

The method shown if FIG. 2, which corresponds to the method of the prior art, results in each laser pulse partially impinging an already demetallized and, thus, thermally stressed region of the sheet surface 10. If inadequate cooling time is provided, deformation and damage to the thermoplastic material of the sheet 1 results, especially in extremely thin sheets.

Figure 3:
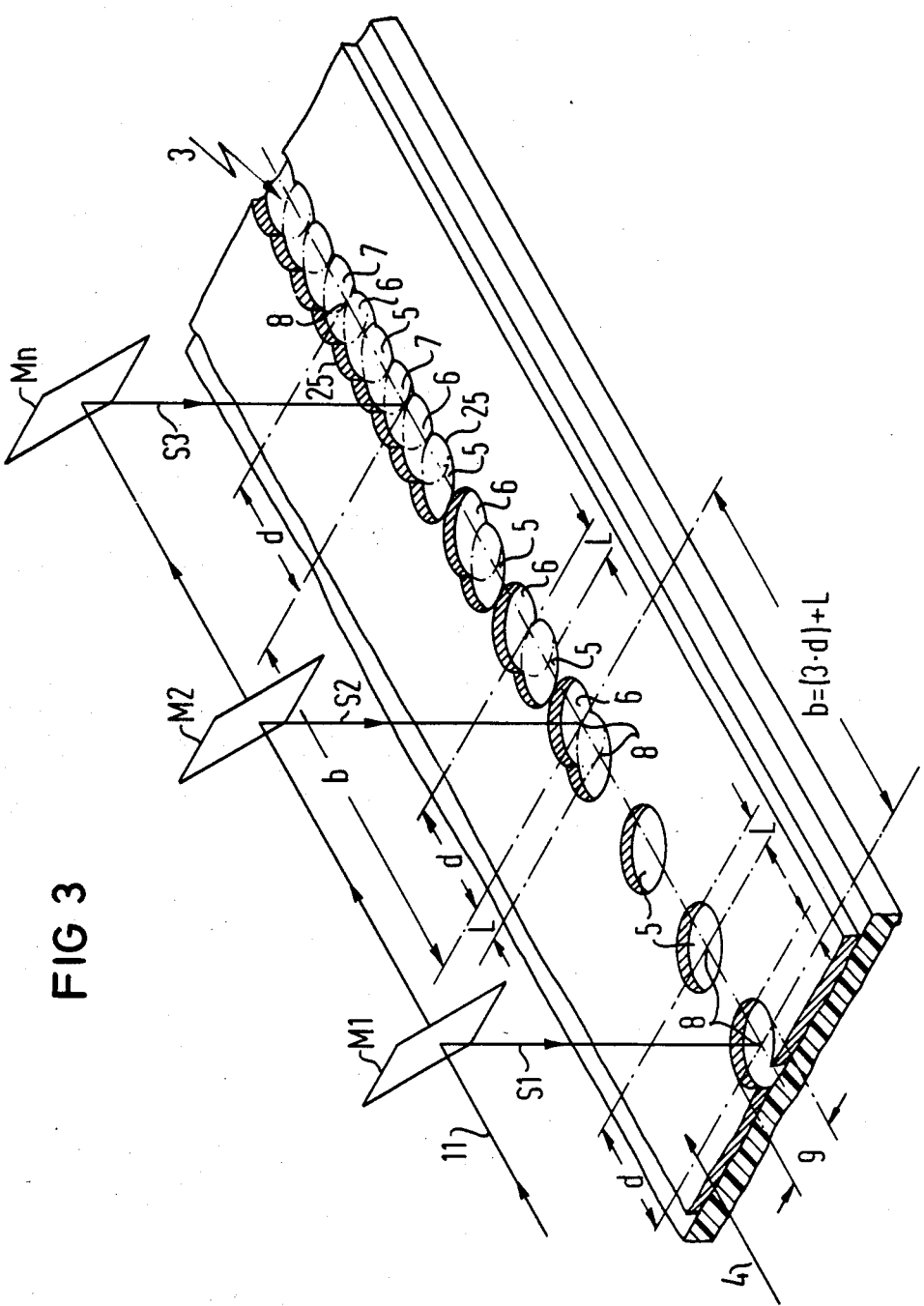
FIG. 3 is a perspective view showing the formation of a metal-free strip in accordance with the principles of the present method using three laser beams.

The present invention, which is schematically shown in FIG. 3, avoids this disadvantage. A plurality (n=3) of laser beams are generated from a single laser beam 11 by using two semi-reflecting mirrors M1 and M2, and a totally reflecting mirror $M_n$. Since the resulting laser beams S1, S2 and S3 are generated from a single parent beam 11, the beams are synchronized without technical and/or economic expenditure.

In one embodiment of the present method, sheets of polyethylene terephthalate having a thickness of 2 micrometers and coated with an aluminum layer 2 having a thickness of 30 nanometers is used.

The laser beams S1, S2 and S3 are reflected from the parent beam 11 at 90° angles by the two semi-reflecting mirrors M1 and M2, and by the totally reflecting mirror $M_n$. The beams S1, S2 and S3 are deflected and directed onto the metallized sheet surface 10 such that they are arranged parallel to one another in a single plane and impinge the sheet surface 10 perpendicularly in a region of a strip 3 to be demetallized.

The laser used in the above-specified example is a neodymium-YAG-laser of sufficiently high power so that a pulse duration of 250 nanoseconds generates metal-free areas 5, 6 and 7 in the metal layer 2 at each laser pulse of the three laser beams S1, S2, and S3. The beam power of each of the laser beams S1, S2 and S3, in the specified embodiment, is from 2 watts through 5 watts, and in one embodiment is 3.75 watts. The area demetallized by each laser pulse has a simple circular shape of a radius L of 0.1 mm, while the clock frequency f of the laser is preferrably 10 kHz. The clock frequency f can also be arbitrarily reduced and adapted to the necessities of the method.

In accordance with the present method, the band feed rate v and the laser clock frequency f are matched to one another such that the clock spacing distance d of the centers 8 of two successive areas demetallized by the same laser beam is three times the area radius L. The resulting feed rate v is three times higher than a method using a single laser beam at the same clock frequency f.

For a given clock spacing d of $3 \times L = 0.3$ mm, the demetalizing rate obtainable at a clock frequency f of 10 kHz is three meters per second. When oblong areas 27 as set forth in FIG. 1c are used in place of the circular areas having a radius L of 0.1 mm, the demetalizing rate can be increased. For instance, if an oblong hole having a length 22 of 0.5 mm are used for forming the metal-free strips at a clock spacing d of $3 \times 0.3$ mm, then the resulting demetallization rate is raised to nine meters per second, or 32.4 killometers per hour, for the same clock frequency of 10 kHz. This value can be increased even further by increasing the number n of laser beams used.

The distance over which the sheet material 1 moves to cool sufficiently is referred to as a cooling distance b. The cooling distance b should be greater than a whole multiple of the clock spacing d by the $n^{th}$ part of the clock spacing d. In other words, the cooling distance b should be greater by the radius L of the demetallized areas 5, 6 and 7. In the illustrated embodiment of FIG. 2, the cooling distance b is $3 \times d (+L) = (3 \times 3L) + L = 10L$.

In the illustrated embodiment, the cooling phase between the incidence of a laser pulse on an already demetallized area of the sheet 1 extends over three clocks of the pulsed laser. The cooling phase is, thus, longer by factor of 3 than a single laser beam method.

For purposes of illustration, FIG. 3 shows a cooling distance b of only $10 \times L$, or 1 cm. However, in practice, the cooling distance b will most certainly be selected to be significantly larger so that the cooling phase extends over a greater cooling distance. For example, a cooling phase of 20 or more clocks of the laser corresponds to a cooling distance of 6.1 cm or more.

That portion of the sheet 1 which has moved beyond the third laser beam S3 includes a completely demetallized strip 3 formed of overlapping circular areas 5, 6 and 7. For a given clock cycle f, this strip 3 has been formed in one-third of the time required for its formation with a single laser beam. Respectively, the cooling phase is three times longer than in single laser beam methods and the strip is formed without risk of a thermoplastic deformation of the sheet.

Referring to FIG. 4, a sheet 1 to be demetallized is guided between two neighboring laser beams S1 and S2 by an arrangement 28 of three deflecting rollers 12, 13 and 14. The rollers 12, 13 and 14 are formed of metal or some other material having good thermal conducivity. The distance 29 between the neighboring laser beams S1 and S2 can, thus, be shorter than the required cooling distance b of a sheet 1 in a single plane. The three deflection rollers 12, 13 and 14 are arranged in the illustration of FIG. 4 so that an axis 15 and 16 of the first and third deflection rollers 12 and 14 lie in plane 17 and so that the second deflection roller 13 lies outside of the plane 17. The spacing of the second roller axis 19 from the plane 17 is adjustable to provide a longer or shorter cooling phase between overlapping beam pulses.

As is apparent from the foregoing specification, the invention is suceptible to being embodied with various alterations and modifications which may differ particularly from those that have been described in the preceeding specification and description. It should be understood that I wish to embody within the scope of the patent waranted hereon all such modifications as reasonably and properly come within the scope of my contribution to the art.

I claim as my invention:

1. A method for forming metal-free strips on a plastic sheet provided with a thin layer of vaporizable metal from which to manufacture electrical capacitors, comprising the steps of:

moving the metallized plastic sheet at a feed rate relative to an n number of laser beams arranged parallel to one another in a plane parallel to the direction of said sheet movement, said n number of laser beams being greater than one;

pulsing said n number of laser beams with a predetermined frequency;

vaporizing one area of the metal layer at each laser pulse for each laser beam due to the duration and intensity of the individual pulses, said one areas each having a center and a length in the direction of said sheet movement and a width substantially transverse of said length;

determining a clock spacing of centers of said one areas depending on said feed rate of the metallized plastic sheet and said predetermined frequency of the laser pulses, said clock spacing of two successive ones of said one areas vaporized being equal at least to an n multiple of half of said length and at most to an n multiple of said length shortened by half said width;

providing a cooling distance between said centers of said one areas vaporized by neighboring ones of said laser beams, said cooling distance being a distance greater by an $n^{th}$ part of said clock spacing than a whole multiple of said clock spacing of successive ones of said one areas vaporized by the same laser beam.

2. A method as claimed in claim 1, wherein said metal layer is regenerably thin.

3. A method as claimed in claim 1, wherein said metal layer is of aluminum.

4. A method as claimed in claim 1, further comprising the step of:

generating said n number of laser beams from a single laser beam using $n-1$ semireflecting mirrors and a totally reflecting mirror wherein said n number of laser beams are substantially of the same energy.

5. A method as claimed in claim 1, further comprising the step of:

guiding said metallized plastic sheet between two neighboring laser beams through at least one arrangement of three deflection rollers wherein the axis of first and third ones of said deflection rollers lie in a first plane and a second one of said deflection rollers is disposed between said first and third deflection rollers outside said first plane so that the cooling distance is increased for said metallized plastic sheet without increasing the spacing between neighboring ones of said laser beams.

6. A method as claimed in claim 5, wherein said three deflection rollers are of material having good thermal conductivity to facilitate heat removal from said metallized plastic sheet between neighboring ones of said laser beams.

7. A method as claimed in claim 5, wherein said second deflection roller is adjustable in distance from said first plane for adjusting a cooling path distance.

8. A method as claimed in claim 1, wherein said n number of laser beams perpendicularly impinge a surface of said metallized plastic sheet.

9. A method as claimed in claim 1, further comprising the step of:

influencing the beam cross-section of said n number of laser beams by introducing at least one optics into the beam path.

10. A method as claimed in claim 9, wherein said beam cross-section is in the form of an ellipse having a longitudinal expanse coinciding with the direction of said sheet movement.

11. A method as claimed in claim 9, wherein said beam cross-section is in the form of an oblong hole having a longitudinal expanse coinciding with the direction of said sheet movement.

12. A method as claimed in claim 1, wherein said plastic sheet is substantially transparent to the emissions of said laser beam.

* * * * *